(12) United States Patent
Fan

(10) Patent No.: US 7,575,461 B2
(45) Date of Patent: Aug. 18, 2009

(54) LAND GRID ARRAY SOCKET WITH IMPROVED LEVER STRUCTURE

(75) Inventor: Chia-Wei Fan, Tu-cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 12/157,624

(22) Filed: Jun. 11, 2008

(65) Prior Publication Data

US 2008/0305654 A1 Dec. 11, 2008

(30) Foreign Application Priority Data

Jun. 11, 2007 (CN) .......................... 2007 2 0039790

(51) Int. Cl.
*H01R 4/24* (2006.01)

(52) U.S. Cl. ..................................................... 439/331

(58) Field of Classification Search ................. 439/331, 439/330, 73, 263, 264, 268, 342
See application file for complete search history.

(56) References Cited

U.S. PATENT DOCUMENTS

| 7,033,198 | B2 * | 4/2006 | Chiang | 439/331 |
| 2005/0202708 | A1 * | 9/2005 | Hashimoto | 439/331 |
| 2006/0116016 | A1 * | 6/2006 | Szu | 439/331 |

* cited by examiner

*Primary Examiner*—Phuong K Dinh
(74) *Attorney, Agent, or Firm*—Wei Te Chung

(57) ABSTRACT

An LGA socket includes an insulative housing with a number of terminals. A stiffener and a load plate are coupled to each other. The insulative housing is disposed between the load plate and the stiffener. A lever includes an actuating portion and a retaining portion rotatably mounted to the stiffener. The retaining portion has a neck portion and a stop portion at a free end thereof to prevent the lever taking side moving relative to the stiffener.

2 Claims, 6 Drawing Sheets

LAND GRID ARRAY SOCKET WITH IMPROVED LEVER STRUCTURE

FIELD OF THE INVENTION

The present invention relates to an Land Grid Array (LGA) socket, and more particularly to an LGA socket with an improved lever which is assembled to a stiffener and the lever is prevented from coming of the stiffener after the lever assembled thereto by means of a neck limited by a stopper from the stiffener.

DESCRIPTION OF RELATED ART

LGA sockets are more and more popular in the area of computer and are used for connecting a CPU to a PCB.

Referring to FIG. 6, which depicts a conventional LGA socket. The LGA socket comprises an insulative housing 91 and a number of terminals (not labeled) received in the insulative housing 91. A stiffener 92 is positioned around a periphery wall of the insulative housing 91. A load plate 93 is pivotally mounted on one end of the stiffener 92 and a lever 94 is pivotally mounted on the other end of the stiffener 92. A clasp 95 is displaced at a free end of the lever 94 against the stiffener 92 for preventing the lever 94 moving from a side of the stiffener 92. The stiffener 92, the load plate 93 and the lever 94 are used for securing the CPU in the insulative housing 91 which electrically connects the CPU with the PCB.

The metal stiffener 92 is in form of rectangular shape and has a central opening (not labeled) for attaching the insulative housing 91. The stiffener 92 includes a first end 921, a second end 922 opposite to the first end 921 and a pair of sidewalls 923 connecting the first end 921 and the second end 922.

The lever 94 is bent from a metal bar. The lever 94 includes a retaining portion 940 and an actuating portion 941 perpendicularly bent from a distal end of the retaining potion 940. The retaining portion 940 has a locking portion 942 in the middle thereof adapt to locking the load plate 93 to the stiffener 92. An outwardly curved section is formed at a distal end of the actuating portion 941 for convenient operation.

However, this type of LGA socket needs a clasp 95 to secure the lever 94, which complicates the manufacturing process. Thus, there is a need to provide a new LGA socket that overcomes the above-mentioned problem.

SUMMARY OF THE INVENTION

According, an object of the present invention is to provide an LGA socket with an improved lever for well establishing an electrical connection between an LGA socket and a PCB.

In order to achieve the object set forth, an LGA socket comprises a metallic stiffener defining an opening and providing a first support at a first end, and a second support at the second end. An insulative housing defines a substantially rectangular cavity in a middle thereof and is supported within the opening of the stiffener. A metal cover is pivotally assembled to the first support and a lever is rotationally assembled to the second support. The lever includes an actuating and a retaining portion, a neck provided adjacent to a free end of the retaining portion and limited by a stopper of the second support once the lever is assembled to the stiffener.

In order to further achieve the object set forth, an land grid array (LGA) socket comprises an insulative housing and a stiffener mounted on the insulative housing. The stiffener has a first sidewall and a second sidewall opposite to the first sidewall. A load plate is pivotally mounted on a first end of the stiffener. A lever is supported by a second end of the stiffener and has a first retaining portion and a second retaining portion. The first retaining portion of the lever has a neck portion and a stop portion disposed at a free end thereof wherein the stop portion against the first sidewall of the stiffener to limit the lever taking side motion.

DETAILED DESCRIPTION OF THE INVENTION

Figure 1:
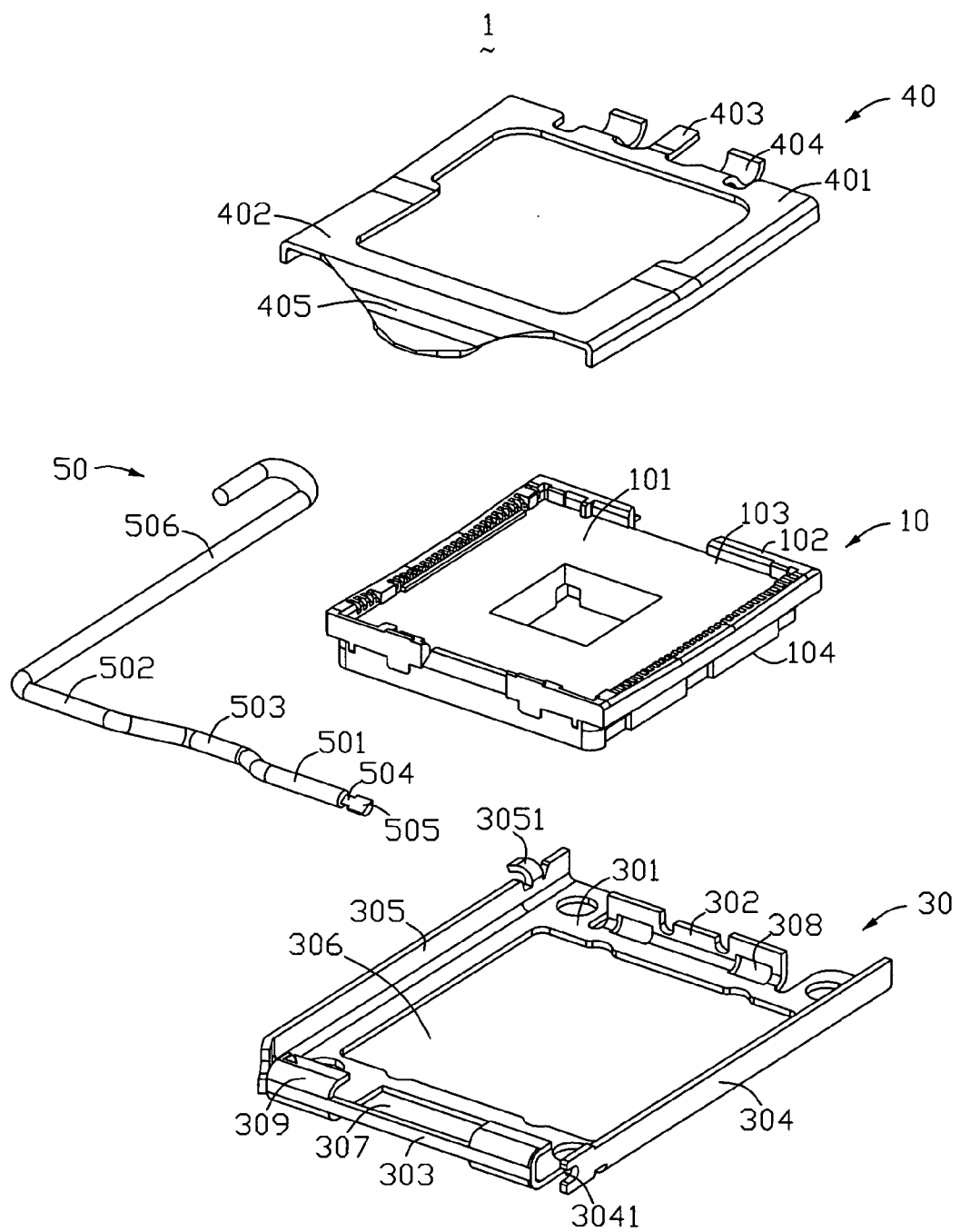
FIG. 1 is an exploded view of an Land Grid Array (LGA) socket in accordance with a preferred embodiment of the present invention.

Reference will now be made to the drawing figures to describe the preferred embodiment of the present invention in detail.

Referring to FIG. 1, an LGA socket 1 has an insulative housing 10 with a plurality of contacts (not shown), a stiffener 30 attached to the insulative housing 10, a load plate 40 pivotally mounted to one end of the stiffener 30 being rotary between an opened position and a closed position, and a lever 50 pivotally supported at the other end of the stiffener 30 adapted to lock the load plate 40 to the stiffener 30.

The insulative housing 10 has a rectangular shape with a top surface 103 and a bottom surface 104. The top surface 103 is provided with a plurality of periphery walls 102 which form an electrical region 101 adapt for receiving an LGA package (not labeled). The electrical region 101 has a plurality of passageways (not labeled) displaced as matrix extending from the top surface 103 to the bottom surface 104 to receiving the contacts.

The stiffener 30 is formed to a rectangular frame with a bottom surface 301. The bottom surface 301 includes a front wall 302 bent upwardly therefrom with the load plated 40 mounted thereon. A rear wall 303 bends upwardly from the bottom surface 301 with the lever 50 pivotally supported thereon. A pair of sidewalls 304, 305 integral connect with the front wall 302 and the rear wall 303, respectively. A U-shaped notch 3041 is provided at a rear end of the side wall 304 for pivotally supporting the lever 50. An interlocking element 3051 is formed integrally with a front end of the sidewall 305 at an upper edge. The bottom surface 301 provides an opening 306 for receiving the insulative housing 10 and an aperture 307 near the rear wall 303. The front wall 302 has a pair of latching slots 308. The rear wall 303 has a plurality of retaining elements 309 bending toward the opening 306.

The load plate 40 is a metal frame. The load plate 40 includes a retaining side 401 adapt for attaching to the stiffener 30 and a pressing side 402 opposite to the retaining side 401. The retaining side 401 provides a pair of bearing tongues 404 curved downwardly. The bearing tongues 404 are attached to the latching slots 308 of the stiffener 30 and rotate between an open position and a close position. A holding element 403 is formed between the bearing tongues 404 to prevent the load plate 40 over rotation. The holding element 403 extends outwardly from the retaining side 401 and is at the same height as the load plate 40. The pressing side 402 has a curve tongue 405 extending downwardly for engaging with the lever 50.

The lever 50 is bent from a metal bar and is formed as a L-shaped. The lever 50 is pivotally mounted on the retaining elements 309 which includes a first retaining portion 501, a second retaining portion 502 and a locking portion 503 formed between the first retaining portion 501 and the second retaining portion 502. A free end of the second retaining portion 502 has an actuating portion 506 for rotating the lever 50 relative to the stiffener 30. A neck portion 504 and a stop portion 505 are formed on a free end of the first retaining portion 501. The neck portion 504 has a half-cylinder shape which is provided with a curved surface and a planar surface. The stop portion 505 also has a half-cylinder shape which has a common planar surface with the neck portion 504. The diameter of the stop portion 505 is bigger than the diameter of the neck portion 504.

Figure 2:
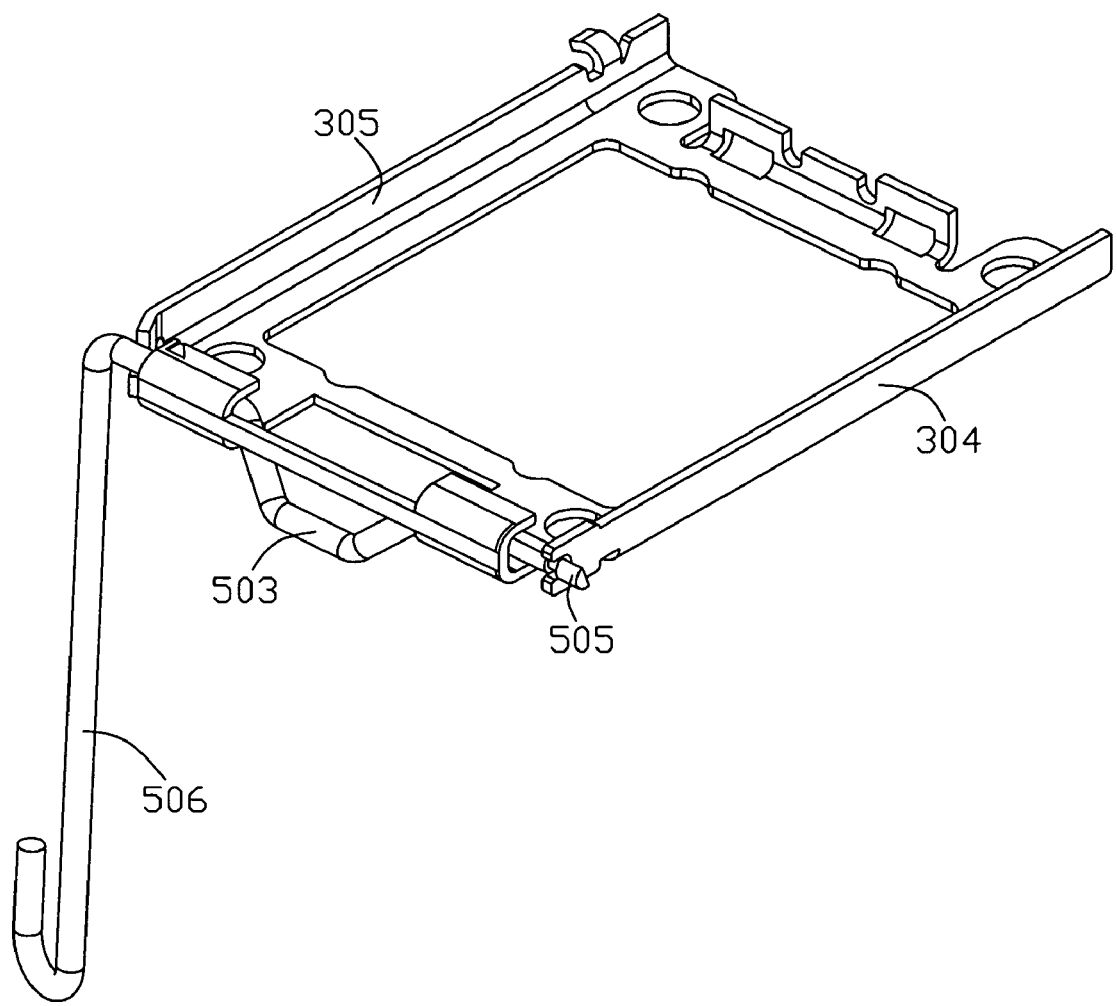
FIG. 2 shows a lever assembled to a stiffener of the LGA socket of FIG. 1.
Figure 3:
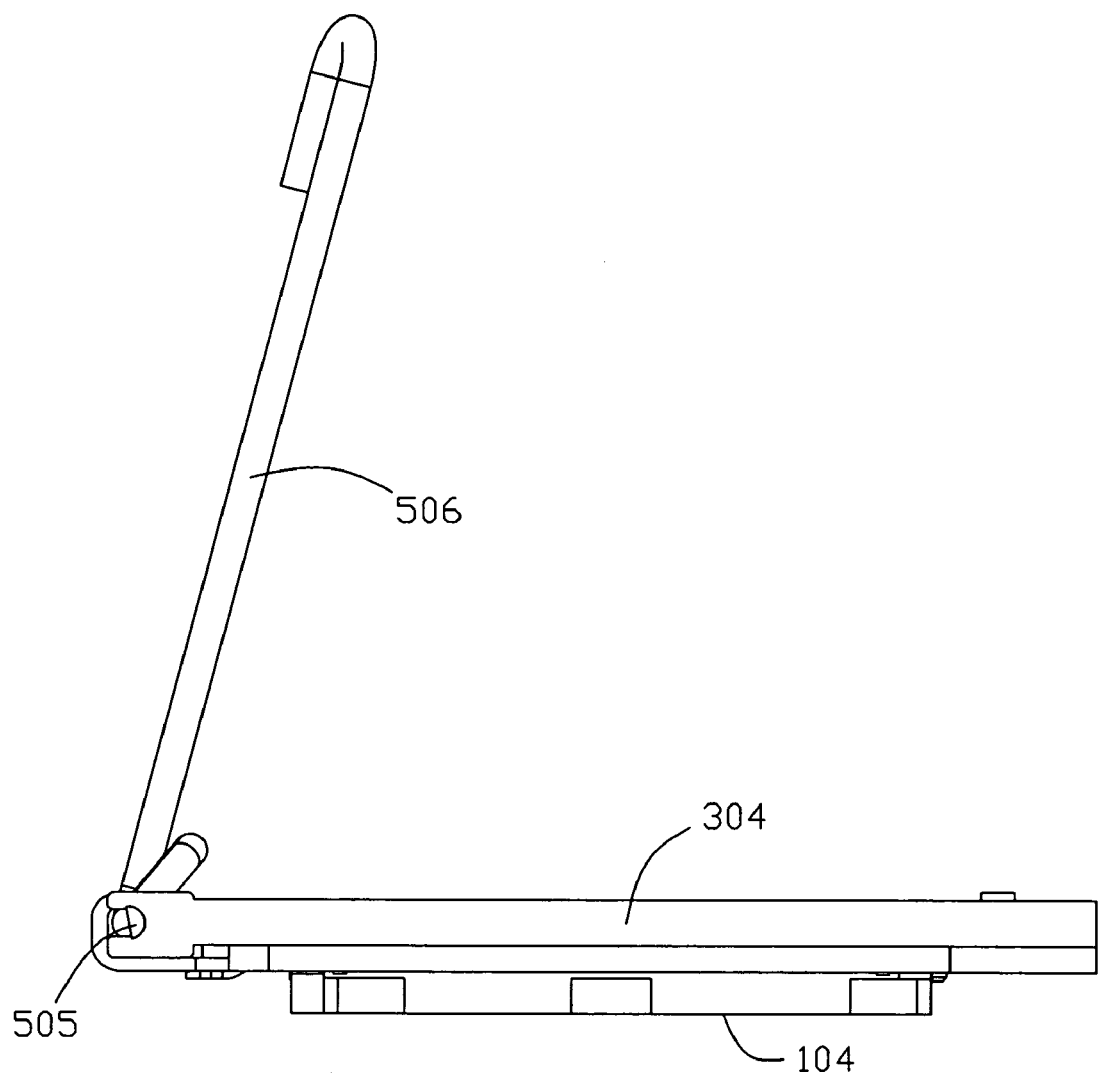
FIG. 3 is an assembled view of the LGA socket of FIG. 1, wherein the lever is at an open position.

In assembly the LGA socket 1, reference to FIG. 2, the lever 50 is assembled to the retaining elements 309 and the sidewall 304 of the stiffener 30 by the actuating portion 506 rotary downwardly below the stiffener 30. As shown in FIG. 2, the locking portion 503 could rotate in the aperture 307 and without interference with the stiffener 30. By rotation the actuating portion 506 above the stiffener 30, put the insulative housing 10 in the opening 306 of the stiffener 30. Then, the bearing tongues 404 of the load plate 40 are pivotally mounted on the latching slots 308 of the stiffener 30. As shown in FIG. 3, when the lever 50 is disposed in an open position, the curved surface of the neck portion 504 is against to the notch 3041 of the sidewall 304 and the stop portion 505 is used to prevent movement of the lever 50 away from the sidewall 304 of the stiffener 30.

Figure 4:
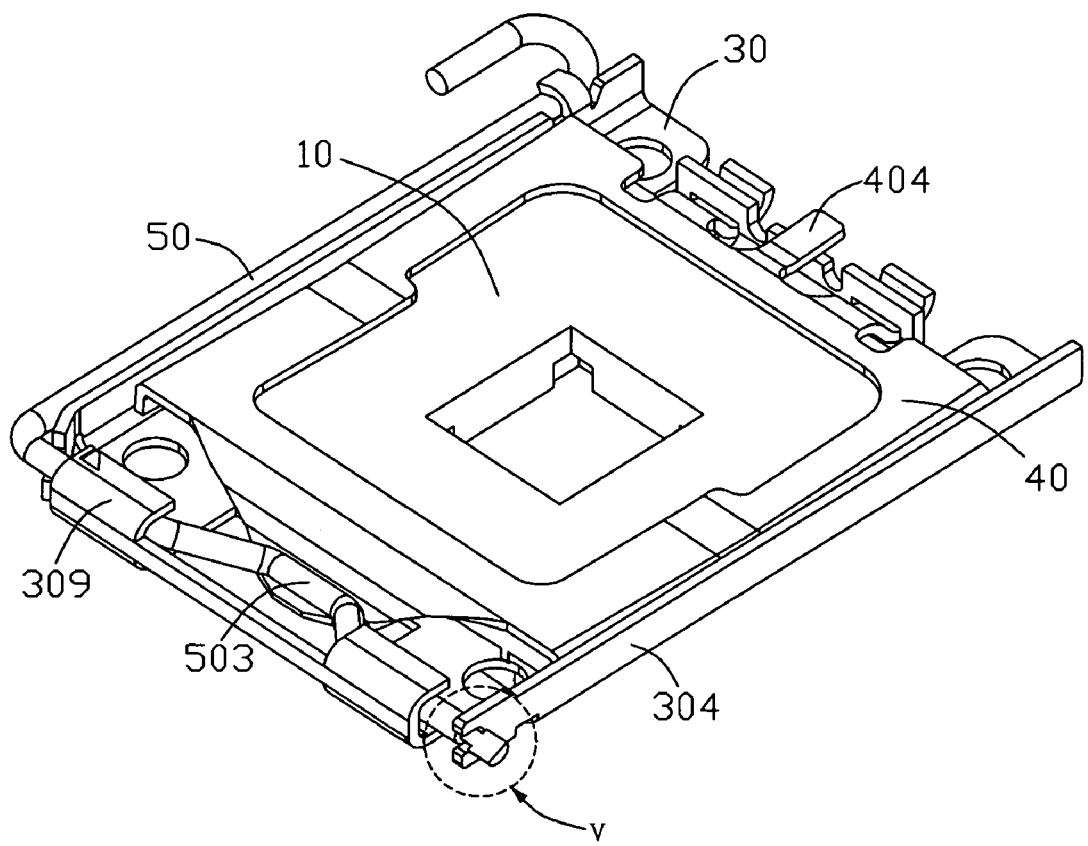
FIG. 4 is another assembled view of the LGA socket of FIG. 1, wherein the lever is locking a load plate to the stiffener.
Figure 5:
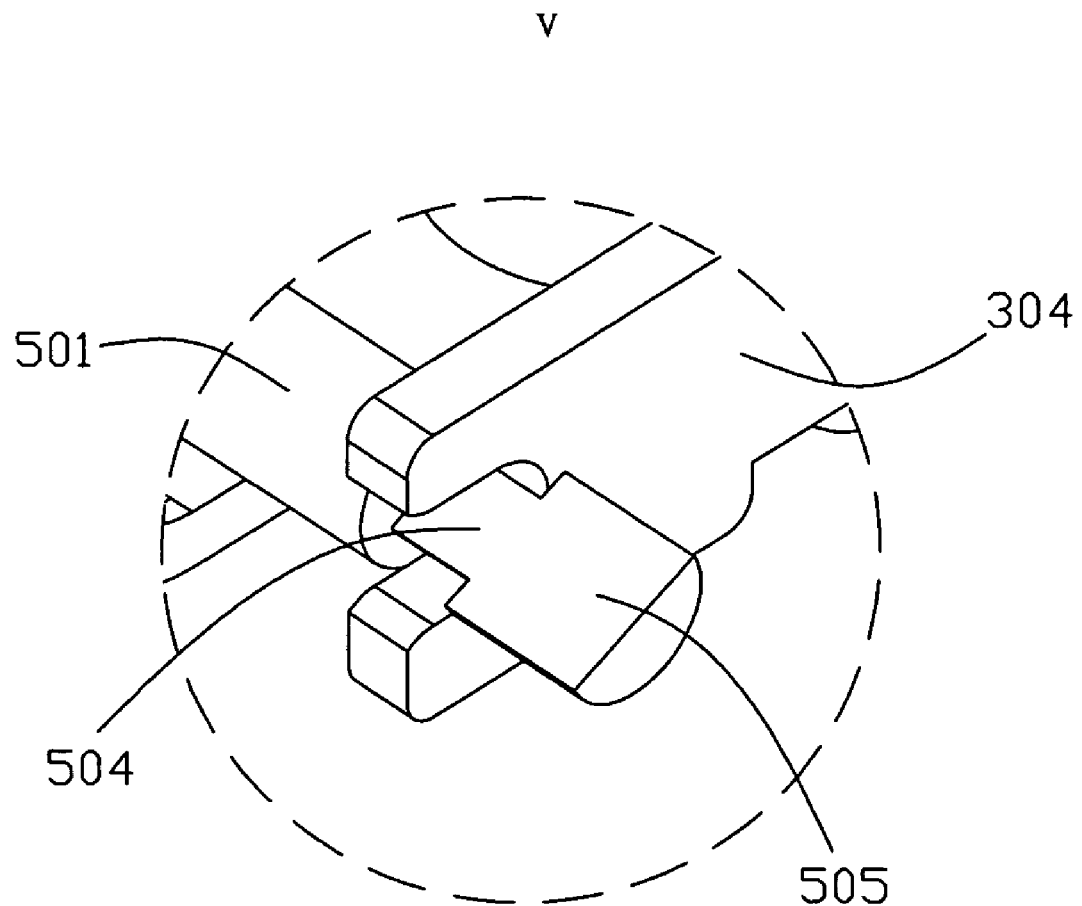
FIG. 5 is an enlarged sectional view of the circle V of FIG. 4.
Figure 6:
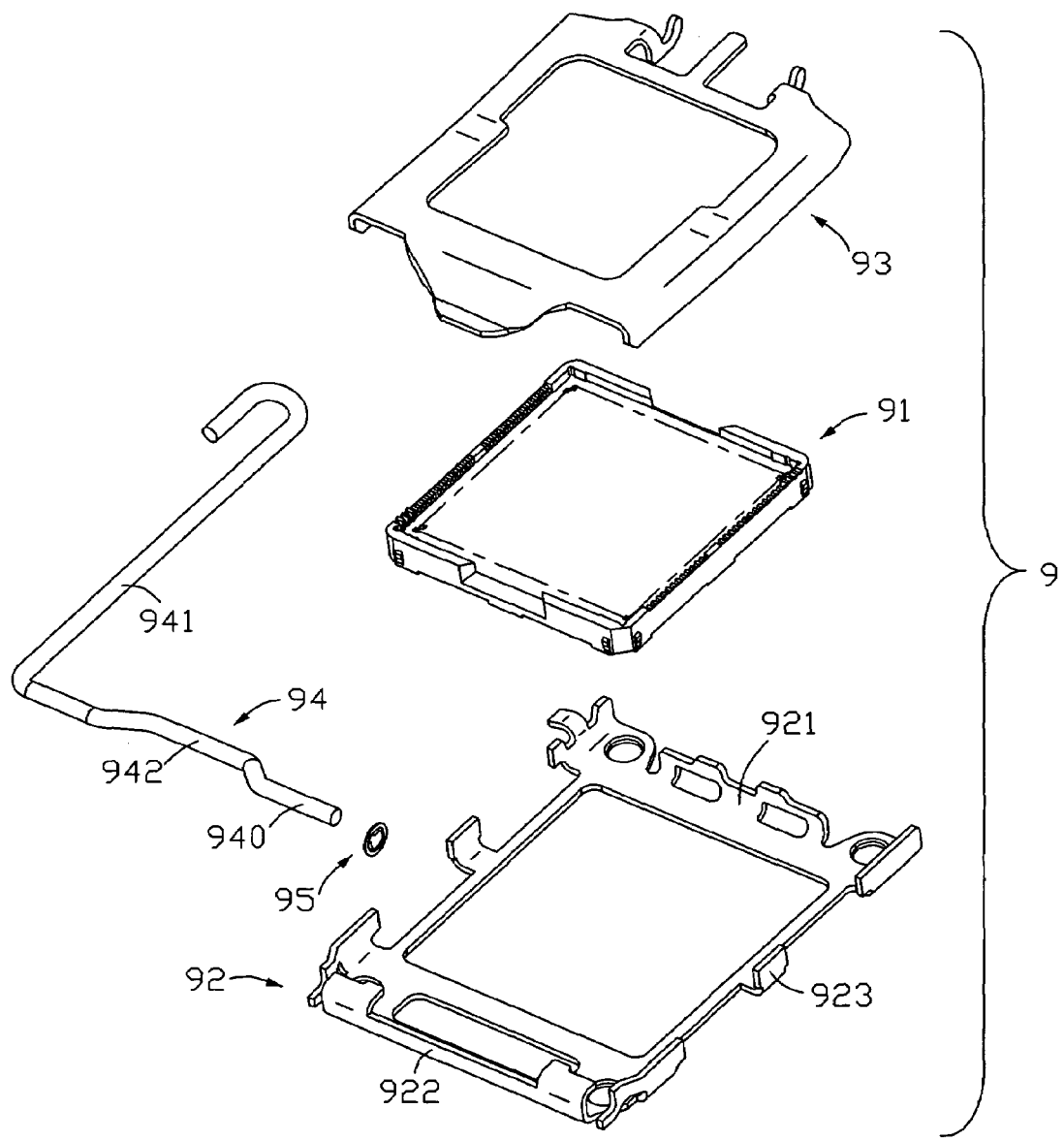
FIG. 6 is an exploded view of a conventional LGA socket.

Reference to FIG. 4 and FIG. 5, when the LGA socket 1 is in a close position, the locking portion 503 of the lever 50 presses the tongue 405 of the load plate 40 and the actuating portion 506 is locked by the interlocking element 3051. At the closed position, the common planar surface of the neck portion 504 and stop portion 505 is generally faced upwardly.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An land grid array (LGA) socket comprising:
an insulative housing;
a stiffener mounted on the insulative housing, the stiffener having a first sidewall and a second sidewall opposite to the first sidewall;
a load plate pivotally mounted on a first end of the stiffener; and
a lever supported by a second end of the stiffener and having a first retaining portion and a second retaining portion, the first retaining portion of the lever having a neck portion and a stop portion disposed at a free end thereof;
wherein the stop portion abuts againsts the first sidewall of the stiffener to limit the lever taking side motion, wherein said neck portion is a half-cylinder and the diameter of said neck portion is smaller than said retaining portion, wherein said stop portion is a half-cylinder and the diameter is bigger than said neck portion, wherein said neck portion and said stop portion define a common planar surface, wherein said common planar surface is generally faced upwardly when said lever is in a horizontal plane.

2. An LGA socket comprising:
a metallic stiffener;
an insulative housing surrounded by said stiffener and defining an upwardly facing recess in a top face thereof;
a plurality of contacts disposed in the housing with contacting sections upwardly extending into the recess;
a metallic cover pivotally assembled to one end of the stiffener; and
a lever pivotally assemble to the other end of the stiffener, the lever having a first retaining portion and a second retaining portion the first retaining portion of the lever having a neck portion and a stop portion disposed at a free end thereof; wherein
said lever is essentially of a round bar bent to an L-shaped configuration under condition that one distal end of said round bar is narrower than the adjacent sections to be restrained in a cutout of the stiffener so as to allow said adjacent sections to be stopped by said stiffener, wherein said neck portion is a half-cylinder and the diameter of said neck portion is smaller than said retaining portion, wherein said stop portion is a half-cylinder and the diameter is bigger than said neck portion, wherein said neck portion and said stop portion define a common planar surface, wherein said common planar surface is generally faced upwardly when said lever is in a horizontal plane around said cutout for preventing lateral movement of said lever.

* * * * *